United States Patent [19]
Wong et al.

[11] Patent Number: 5,351,275
[45] Date of Patent: Sep. 27, 1994

[54] DIGITAL SERIAL LOOP FILTER FOR HIGH SPEED CONTROL SYSTEMS

[75] Inventors: Hee Wong; Tsun-Kit Chin, both of San Jose, Calif.

[73] Assignee: National Semiconductor Corporation, Santa Clara, Calif.

[21] Appl. No.: 729,973

[22] Filed: Jul. 15, 1991

[51] Int. Cl.$^5$ ............................................. H03D 3/24
[52] U.S. Cl. .................. 375/120; 364/724.01; 331/32
[58] Field of Search .................. 375/81, 82, 103, 120; 331/32, 34; 364/724.01; 455/183.1, 260

[56] References Cited

U.S. PATENT DOCUMENTS

| | | | |
|---|---|---|---|
| 3,878,473 | 4/1975 | Furtney, Jr. | 331/1 A |
| 4,563,657 | 1/1986 | Qureshi et al. | 375/120 |
| 4,682,116 | 7/1987 | Wolaver et al. | 328/167 |
| 4,752,748 | 6/1988 | Grzeszykowski | 331/1 A |
| 4,821,293 | 4/1989 | Shimizume et al. | 375/81 |
| 4,942,370 | 7/1990 | Shigemori | 331/1 A |
| 5,056,054 | 10/1991 | Wong et al. | 375/120 |
| 5,060,180 | 10/1991 | Kingston et al. | 364/724.03 |
| 5,121,415 | 6/1992 | Goodman et al. | 375/14 |
| 5,239,561 | 8/1993 | Wong et al. | 375/120 |

FOREIGN PATENT DOCUMENTS 0342736  11/1989  European Pat. Off. .
WO89/12931  12/1989  PCT Int'l Appl. .

OTHER PUBLICATIONS

AT&T Advance Data Sheet, "T7351 FDDI Physical Layer Device".

*Primary Examiner*—Stephen Chin
*Assistant Examiner*—T. Ghebretinsae
*Attorney, Agent, or Firm*—Townsend and Townsend Khourie and Crew

[57] ABSTRACT

A digital programmable loop filter for high frequency control systems applications utilizing a serial processing technique on pulse densities. The loop filter contains a proportional signal path and an integral signal path. A 4-time-slot sequencer time-multiplexes the serial proportional and integral signals to emulate a 1-pole/1-zero filter. An acquisition speed control circuit controls the acquisition time as well as step sizes of the scaler (proportional path) and the integrator (integral path) to provide loop variable programmability.

18 Claims, 8 Drawing Sheets

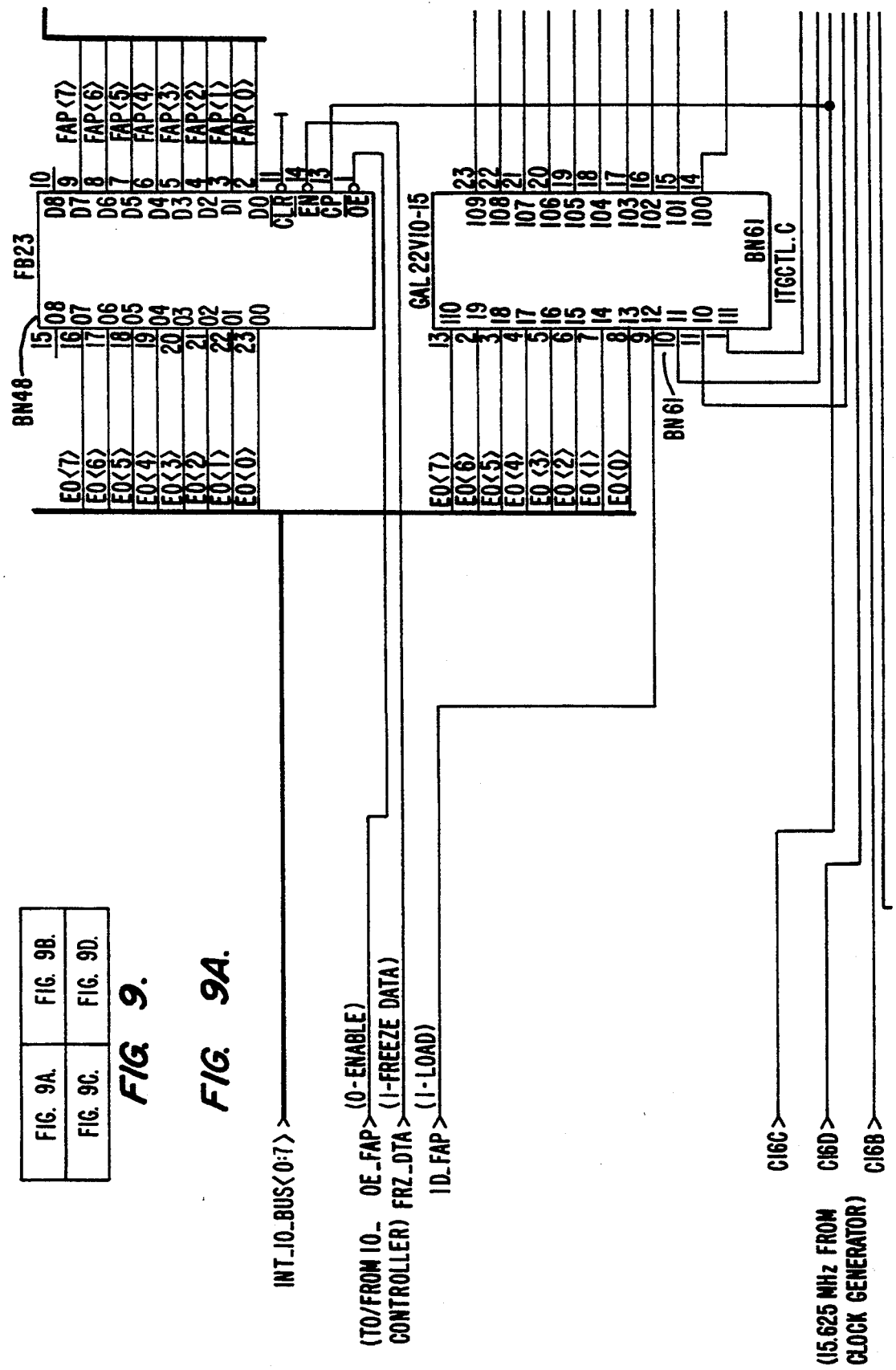

DIGITAL SERIAL LOOP FILTER FOR HIGH SPEED CONTROL SYSTEMS

COPYRIGHT NOTICE

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND OF THE INVENTION

The present invention relates to a digital serial programmable loop filter for use in high frequency control systems such as 125 MHz Fiber Distributed Data Interface (FDDI) Phase-Locked Loop (PLL) applications.

In control systems such as PLLs, 2nd order loops are widely used due to their good dynamic tracking performance. In general, the tracking characteristic is heavily influenced by the bandwidth and the damping factor of the loop. To optimize the loop performance, it is important to minimize the variations in these two parameters caused by component or process tolerances. As a consequence, a digital approach is preferred over an analog approach for constructing the loop filter because performance variations due to component/process tolerances can be eliminated.

Digital implementations of high frequency loop filters have, however, typically utilized multi-bit parallel processing which adds to circuit complexity and size and cost.

From the above it is seen that an improved loop filter is desired for high frequency control system applications.

SUMMARY OF THE INVENTION

The present invention provides a serial digital programmable loop filter for high frequency control system applications.

The filter utilizes a pulse density modulation technique in a serial processing architecture to achieve high speed filtering with minimum circuit area and stable performance over process variations. To ensure compliance to any particular control system acquisition timing specifications, automatic adjustment is implemented to speed up the acquisition process without compromising the loop performance. Furthermore, testing capabilities are included for configuring and diagnosing the loop by simple digital means.

Accordingly, in one embodiment, the present invention provides a digital serial programmable loop filter for high frequency control systems comprised of an input terminal adapted to receive a serial digital input signal carrying loop error information, a serial digital signal processor coupled to the input terminal for filtering the input signal by processing pulse densities of the input signal, and an output terminal coupled to the processor for carrying a serial output signal representing the filtered value of the serial input signal.

The present invention also provides, according to one embodiment, a method of filtering a signal in a high frequency phase locked loop. The method includes the steps of inputting a serial digital signal, pulse densities of the signal representative of phase error; processing the serial digital signal so as to filter the serial digital signal based on pulse density of the signal; and outputting a filtered serial pulse density signal.

A further understanding of the invention may be had with reference to the description and drawings below.

DESCRIPTION OF THE PREFERRED EMBODIMENT

Figure 1:
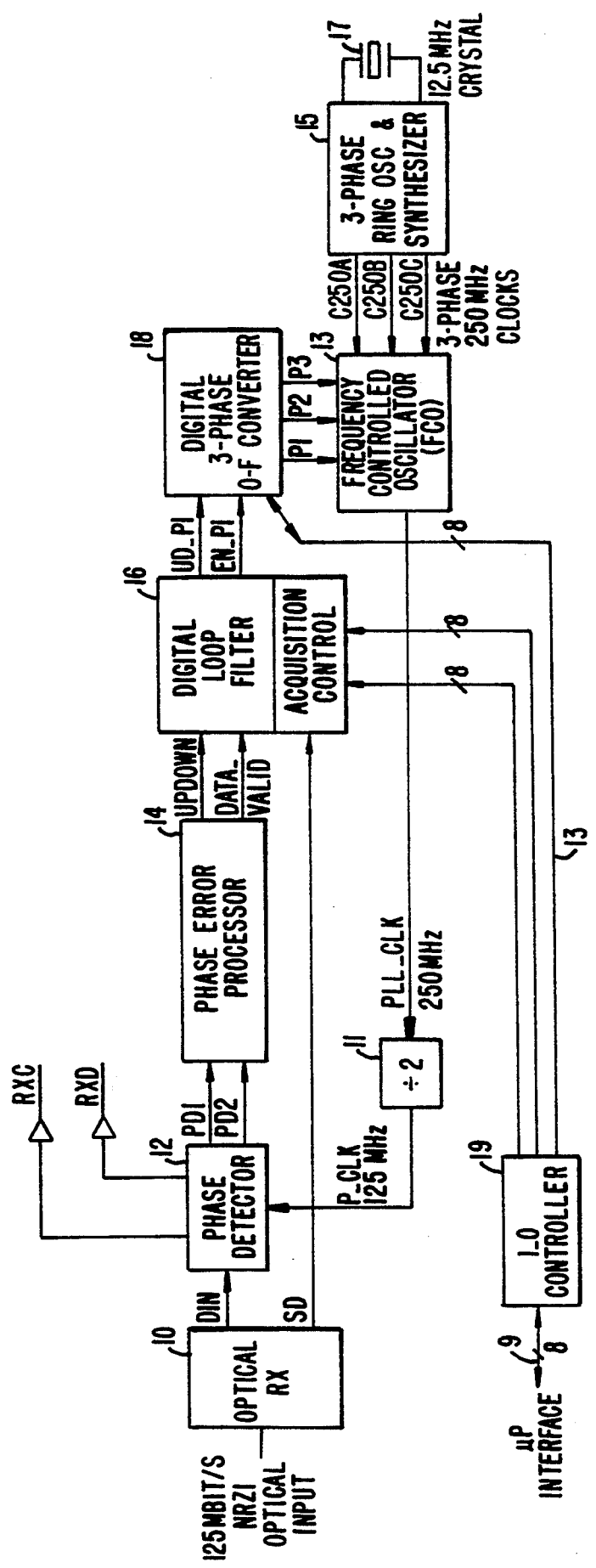
FIG. 1 is a basic block diagram of a phase-locked loop circuit for FDDI applications.

FIG. 1 illustrates the basic block diagram of a PLL circuit for FDDI applications which is exemplary of the implementation of the present invention. The PLL may be fabricated on one or more semiconductor devices, which may further include FDDI or other components. An optical receiver 10 receives, for example, a 125 MBit/S optical input and converts it into an electrical digital signal at its output. A phase detector 12 receives the digital input signal as well as a PLL clock signal P_CLK and determines the phase error between the two signals. A phase error processor (PEP) 14 receives this phase error information and generates two logic signals UP/DOWN and DATA_VALID that carry the phase error information in a serial digital format required by a loop filter 16. When the DATA_VALID is active, the two logic states of UP/DOWN indicate the direction (sign) of the phase error. The loop filter 16 provides an interface between the PEP 14 and a 3-phase phase to frequency converter (PFC) 18. The loop filter 16 outputs (EN_PI and UD_PI) are the inputs to the PFC 18. The pulse density of these two signals determine the frequencies of the 3-phase outputs of the PFC 18. A 3-phase ring oscillator and clock synthesizer circuit 15 in conjunction with a local crystal oscillator 17 generate 3-phase 250 MHz local clock signals. A frequency controlled oscillator (FCO) 13 receives the PFC 18 outputs and the 3-phase 250 MHz local clock signals to generate a PLL phase-locked clock PLL_CLK. A divide-by-2 circuit 11 receives the PLL_CLK signal (FCO 13 output) and generates the 125 MHz PLL clock P_CLK ensuring a 50% duty cycle for the P_CLK signal. The phase to frequency converter is described in greater detail in U.S. application Ser. No. 07/681,095, which is incorporated herein by reference for all purposes. The phase detector is described in greater detail in U.S. application Ser. No. 07/730,228, incorporated herein by reference for all purposes. The phase error processor is described in greater detail in U.S. application Ser. No. 07/731,138, incorporated herein by reference for all purposes. The frequency controlled oscillator is described in greater detail in U.S. Pat. No. 5,132,633 (Attorney Docket No.

A53963), incorporated herein by reference for all purposes.

The optical receiver 10 also generates a signal detect (SD) signal indicating the presence of data energy in the transmission medium. The loop filter 16 uses the SD signal for acquisition control purposes. The two input signals to the loop filter 16 (DATA_VALID and UP/-DOWN) change states at a rate of P_CLK/44 (125 MHz/44), being asynchronous to the loop filter 16 clock. The loop filter 16 is clocked at, for example, 15.625 MHz derived from the clock synthesizer circuit 15. During the period when PEP 14 is updating UP/-DOWN, it forces DATA_VALID low for 3 cycles of P_CLK to prevent meta-stable problems at the asynchronous interface between PEP 14 and the loop filter 16. EN_PI and UD_PI are the two serial outputs from the loop filter 16. They drive the PFC 18, which combined with the FCO 13 and the divide-by-2 circuit 11 emulate the function of a voltage controlled oscillator, correcting the frequency and phase of the PLL clock at P_CLK. An I/O Controller 19 interfaces the loop filter 16 and the PFC 18 to an 8-bit microprocessor bus 9. Via the bus 9 the user can configure the loop and extract important loop information for testing purposes.

Figure 2:
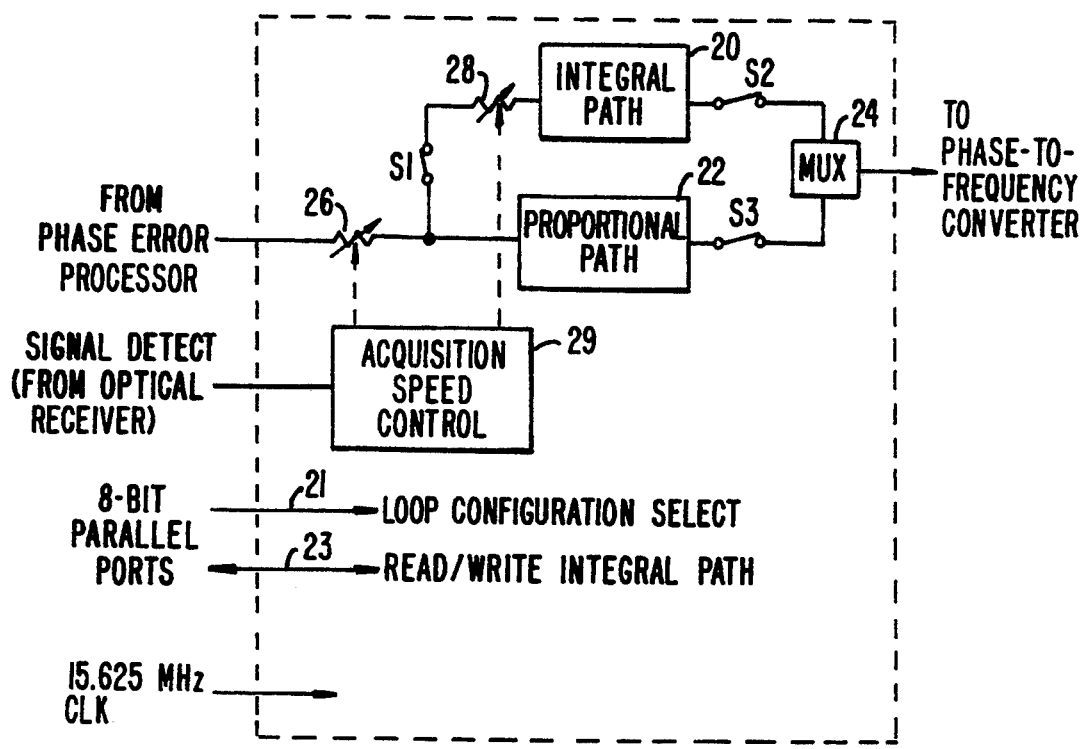
FIG. 2 is a simplified block diagram of the digital loop filter of the present invention.

FIG. 2 shows the simplified block diagram of the digital serial loop filter 16. The filter utilizes a serial, pulse density modulated input data stream. The loop filter 16 includes a proportional signal path 22, an integral signal path 20, a multiplexing circuit 24 and loop parameter control circuits 26 and 28. The filter emulates the function of a 1-pole/1-zero filter. An acquisition speed control circuit 29 dynamically adjusts loop parameters in response to a signal detect (SD) signal from the optical receiver 10. Switches S1, S2, and S3 are used to construct different configurations of the loop (open loop, closed loop, etc.). Two 8-bit parallel ports 21 and 23 interface (via the I/O controller 19 and bus 9) are used via a digital system such as a microprocessor, discrete hardware, or the like, for configuring the loop and accessing the integral contents of the loop filter 16.

A general loop filter is modeled by the transfer function:

$$F(s) = P + I/s$$

where
P = the transfer function of the proportional path 22,
I/s = the transfer function of the integral path 20.

Figure 3:
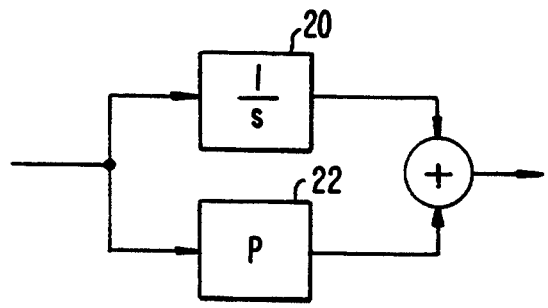
FIG. 3 is a general model of a loop filter.

FIG. 3 illustrates a model of a general loop filter. The damping factor of the (closed loop) PLL is proportional to the ratio of (P**2)/I. To maintain constant damping factor under different loop gain settings, P and I must be adjusted according to the square law relationship. Such arrangement is costly to implement.

Figure 4:
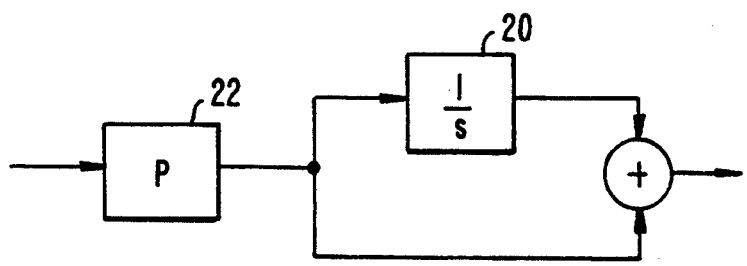
FIG. 4 is a model of the loop filter as implemented in the present invention.

By positioning the scaling factor of the proportional path 22 before the integral path 20 as shown in FIG. 4, the damping factor will become proportional to the ratio of P/I'. The damping factor is maintained constant if the scaling factors of the proportional path 22 and integral path 20 are adjusted linearly. This scheme is more cost-effective.

Figure 5:
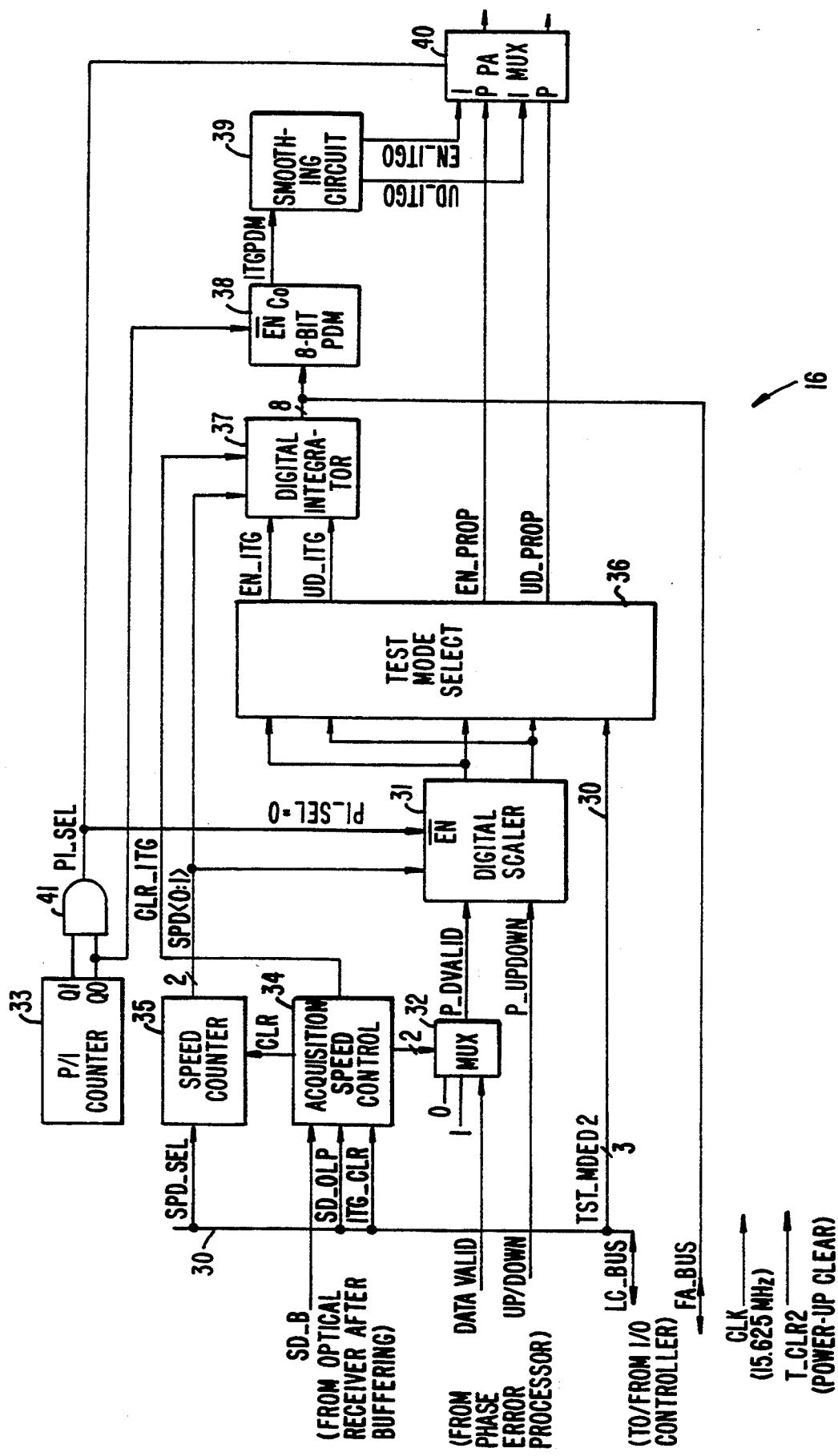
FIG. 5 is a detailed block diagram of the digital loop filter of the present invention.
Figure 6:
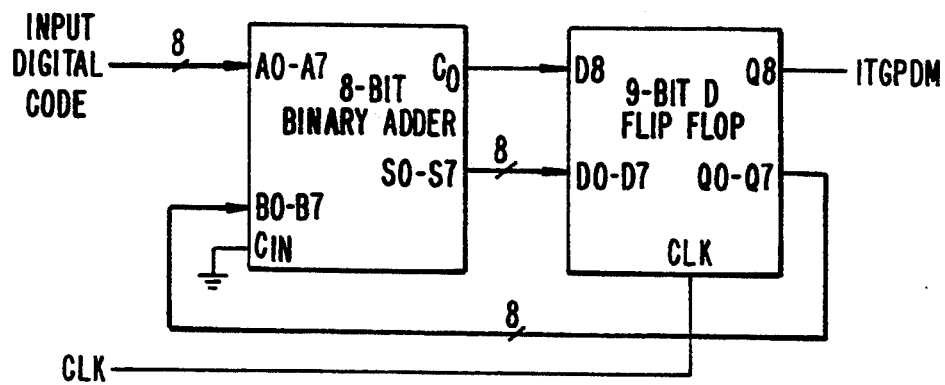
FIG. 6 is a circuit diagram of an 8-bit pulse density modulator.

FIG. 5 shows a more detailed block diagram of the digital loop filter 16. A digital scaler 31 forms the main block of the loop filter 16 proportional path. The digital scaler 31 receives the UP/DOWN signal directly at its P_UPDOWN input, and receives the DATA_VALID signal via a multiplexer MUX 32 at its P_D-VALID input. The MUX 32 is controlled by an acquisition speed controller (ASC) 34 which also controls a 2-bit speed counter 35 with outputs SPD0 and SPD1. The inputs to the ASC 34 are connected to the I/O controller 19 via a bus LC_BUS 30. Once enabled by the ASC 34, the 2-bit speed counter 35 steps through four different speed settings: SPD8X, SPD4X, SPD2X and SPD1X adjusting the scaling factor of the digital scaler 31. The MUX 32 connects P_DVALID to either a logical "1", a logical "0", or DATA—VALID depending on the mode of operation.

A digital integrator 37 forms one of the main blocks of the loop filter 16 integral path. It receives the two outputs of the digital scaler 31 via a test mode select circuit 36. The test mode select circuit 36 facilitates the testing of different loop configurations such as closed-loop, open-loop, enable/disable proportional path and enable/disable integral path. The test mode select circuit 36 communicates with the I/O controller via the LC_BUS 30. The digital integrator 37 also receives the 2-bit speed information SPD0 and SPD1 (from the speed counter 35), adjusting the counting rate of the integrator 37.

An 8-bit Pulse Density Modulator (PDM) 38 receives the parallel outputs of the digital integrator 37 and converts them back into a single serial bit stream at its output. The final block in the loop filter 16 integral path is a smoothing filter 39 which converts the single serial bit stream at the PDM 38 output to two serial digital signals compatible to the proportional path output signals.

A 4-time-slot sequencer eliminates the need for an adder in the loop filter 16 by time-multiplexing the two proportional and the two integral serial signals onto the two outputs of the loop filter EN_PI and UD_PI. A 2-bit P/I counter 33 controls the enable input of the digital scaler 31, PDM 38, as well as the control input of a P/I MUX 40 to emulate the adder function. The duty cycle of the control signal for the P/I MUX 40 introduces scaling factors on both the proportional signal as well as the integral signal, eliminating the need for additional gain stages.

In operation, the loop filter 16 operates as follows. The digital scaler 31 utilizes a variable step size, 3-bit up/down counter which scales the pulse densities of the input signals DATA_VALID and UP/DOWN. Referring to FIG. 5, the two outputs of the P/I counter 33 are ANDed together by AND gate 41 which generates PI_SEL signal at its output. PI_SEL is therefore high (logical "1") once every four counts. When PI_SEL is high (integral time-slots), the 3-bit counter of the digital scaler 31 is disabled and its contents are put on hold. When PI_SEL is low (proportional time-slots), P_D-VALID enables the 3-bit counter (clocked by CLK at 125 MHz/8) to advance or retard according to the logic states of P_UPDOWN. The counter is thus enabled at a rate of (125 MHz/8)*($\frac{3}{4}$), synchronous to the local clock.

When the loop filter 16 is configured for normal PLL operation (not in Test Mode), EN_PROP and UD_PROP are the outputs of the 3-bit counter. EN_PROP signals either an overflow (count-up) or an underflow (count-down) by the counter, and the logic state of UD_PROP indicates the counting direction which reflects the sign of the phase error. During proportional time-slots, the P/I MUX 40 connects these 2 outputs (EN_PROP and UD_PROP) to the loop filter outputs EN_PI and UD_PI.

During signal acquisition, SPD1 and SPD0 (from the speed counter 35) adjust the step size of the digital scaler 31 3-bit up/down counter, and thus the scaling factor of the scaler, Ks. The phase error information carried by DATA_VALID and UP/DOWN is hence scaled by Ks and indicated by EN_PI and UD_PI. Table 1 illustrates representative values of Ks versus SPD1 and SPD0.

TABLE 1

Scaling factor Ks of the 3-bit digital scaler counter at different speed settings

| Speed | SPD1 | SPD0 | Step Size | Scaling Factor, Ks |
|---|---|---|---|---|
| SPD8X | 0 | 0 | ±8 | 1 |
| SPD4X | 0 | 1 | ±4 | $\frac{1}{2}$ |
| SPD2X | 1 | 0 | ±2 | $\frac{1}{4}$ |
| SPD1X | 1 | 1 | ±1 | $\frac{1}{8}$ |

The digital integrator 37 is realized by an 8-bit up/-down counter and a 1-bit (LSB) up/down counter with variable step sizes. The two counters form a 9-bit up/-down counter clocked by the loop filter 16 clock CLK at 15.625 MHz. When the loop filter 16 is configured for normal operation (not in Test Mode), the integrator 37 inputs (EN_ITG and UD_ITG) are connected to the digital scaler 31 outputs. EN_ITG enables the 9-bit counter and UD_ITG controls the counting directions. The carry out TC~ of the 9-bit counter is fedback to inhibit the counter from overflowing or underflowing. Any attempt to further increment or decrement beyond the full counts (hexadecimal FF/1 or 00/0 for the 8-bit/1-bit counters) will be inhibited.

During signal acquisition, SPD1 and SPD0 adjust the step size of the 9-bit counter, and thus the counting rate Wc of the integrator 37. Table 2 lists representative values of Wc (with full counts normalized to ±1) versus SPD1 and SPD0. A step-size of 2 is effectively by-passing the 1-bit LSB counter.

TABLE 2

Counting rates of the integrator 37 at different speed settings

| Speed | SPD1 | SPD0 | Step Size | Integrator Counting Rate, Wc (per 8 nSec) |
|---|---|---|---|---|
| SPD8X | 0 | 0 | 0 | — |
| SPD4X | 0 | 1 | ±2 | 2/(256 × 8) |
| SPD2X | 1 | 0 | ±2 | 2/(256 × 8) |
| SPD1X | 1 | 1 | ±1 | 2/(512 × 8) |

The center value of the 9-bit counter is defined as hexadecimal 80/0 (8-bit/i-bit). Upon power up, an external digital input signal T_CLR2 centers the 9-bit counter (when T_CLR2 is forced low). Users can also read/write the upper 8 bits of the counter through an 8-bit bus $FA_{13}$ BUS.

The 8-bit Pulse Density Modulator (PDM) 38, is clocked by CLK at 15.625 MHz and enabled by the LSB of the 2-bit P/I Counter 33 (=CLK/2). The PDM converts the upper 8-bit parallel code of the integrator 37 9-bit counter to a serial bit stream at the ITGPDM output. The PDM 38 performs a recursive accumulation process on the input digital code and can be realized with, for example, an 8-bit binary adder and a 9-bit D flip/flop register. The pulse density of the adder's carry reflects the binary weighting of the input digital code. FIG. 5 shows a representative circuit diagram of an 8-bit pulse density modulator.

The ITGPDM signal changes state at a rate of CLK/2 and its pulse density (ranging from −1 to +1) replicates the binary weightings of the upper 8-bit counts of the integrator 37. For example, "−1" indicates hex 00, "0" indicates hex 80 and "+1" indicates hex FF.

Figure 7:
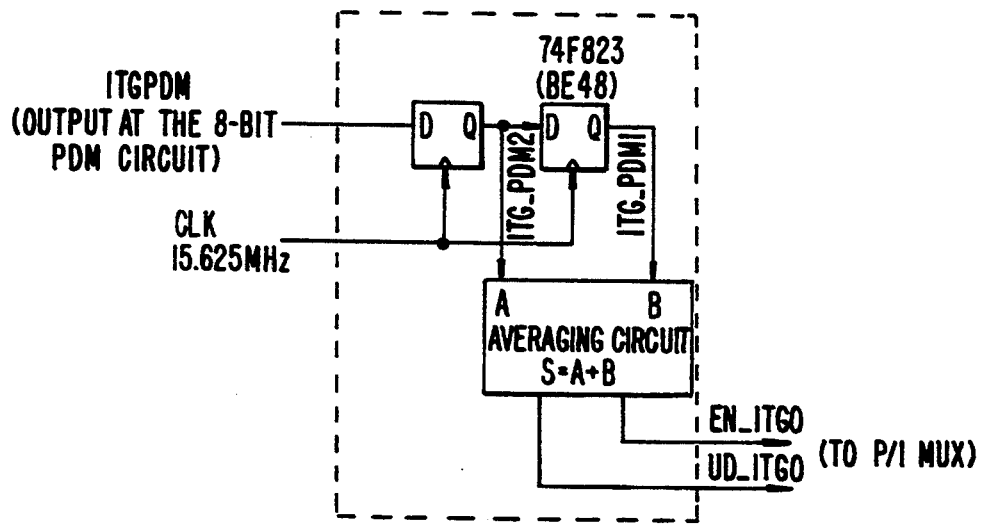
FIG. 7 is a functional diagram of the smoothing circuit used in the integral path of the digital loop filter.

Since the P/I MUX 40 connects the integral path to the PFC 18 at a rate of CLK/4 (integral slot when PI_SEL=logic "1"), a smoothing/decimator circuit is required to interface the ITGPDM signal to the P/I MUX 40. The functional diagram of the smoothing circuit 39 is shown in FIG. 7. As mentioned above, the ITGPDM signal is a binary signal (0 or 1) with pulse density ranging from −1 to +1 and a clocking rate of CLK/2. The smoothing circuit 39 converts the ITGPDM signal two signals EN_ITGO and UD_ITGO which are signal-compatible the P/I MUX 40 (up/down and enable signals) with clocking rate at CLK/4. These two signals contain 3 logic states (up, down and hold) and can be treated as one entity with pulse density ranging from −1 to +1. Table 3 shows the truth table for the conversion.

TABLE 3

Truth table for converting ITGPDM to EN_ITGO and UD_ITGO

| ITGPDM2 | ITGPDM1 | EN_ITGO | UD_ITGO | State |
|---|---|---|---|---|
| 0 | 0 | 1 | 0 | Count down |
| 0 | 1 | 0 | x | Hold |
| 1 | 0 | 0 | x | Hold |
| 1 | 1 | 1 | 1 | Count up |

During integral time-slots when PI_SEL is at logic "1", P/I MUX 40 connects EN_ITGO and UD_ITGO to EN_PI and UD_PI respectively.

In FDDI applications, the Signal Detect output (SD) from the optical receiver 10 asserts within 100 μS after detection of energy at the optical input of the Receiver. The FDDI physical layer is required to recognize valid line states within 100 S after the assertion of the SD. An acquisition speed control circuit which includes the ASC 34, the speed counter 35 and the MUX 32 ensures the PLL's compliance to this timing specification without trading off the PLL's jitter performance.

Figure 8:
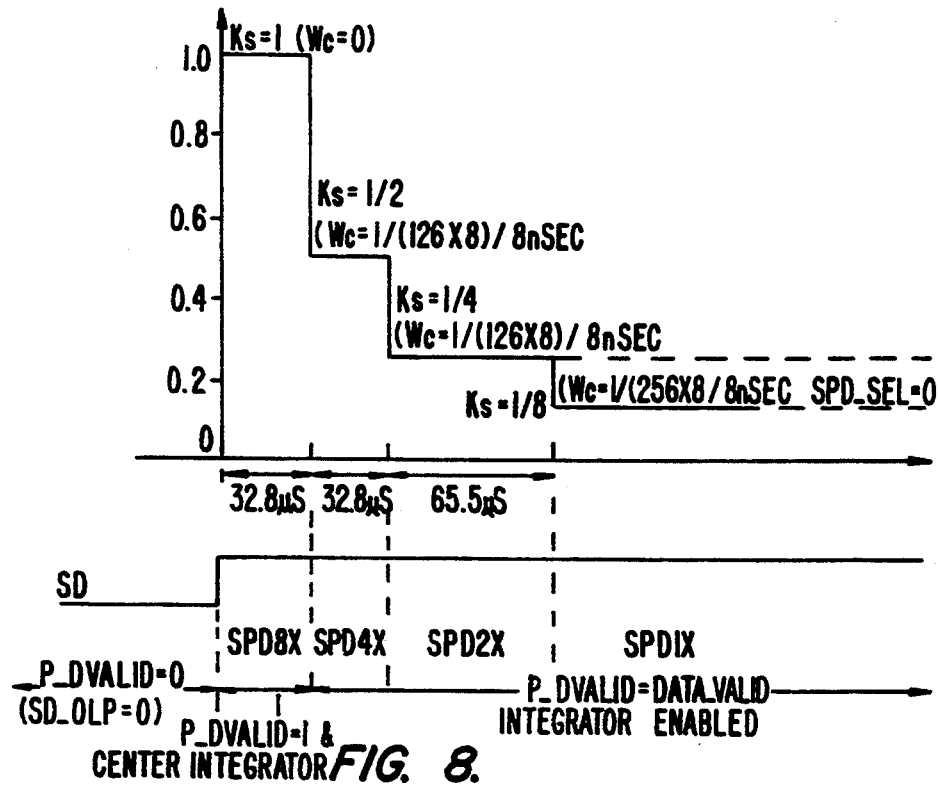
FIG. 8 is a timing diagram of the acquisition speed control circuit for the digital loop filter.

When SD asserts (SD_B="0"), the ASC 34 enables the 2-bit speed counter 35 which steps through states 0, 1, 2 and 3 (labeled as SPD8X, SPD4X, SPD2X and SPD1X) with variable durations as shown in FIG. 8. The speed counter 35 stays at the final state of SPD1X or SPD2X depending on the logic state of SPD_SEL input (one bit of the LC_BUS 30).

At SPD8X, the ASC 34 forces P_DVALID to logic "1" through MUX 32, while the integrator 37 input at EN_ITG is forced to logic "0" (disabled). The integrator 37 is centered and Ks is set to the largest value of 1. The PLL behaves as a 1st order loop with the highest phase tracking speed.

For other speed settings (SPD4X, SPD2X and SPD1X), P_VALID is connected to DATA_VALID and the integrator 37 is enabled for frequency tracking.

The outputs of the speed counter 35 (SPD1 and SPD0) linearly adjust the scaling factor (Ks) of the digital scaler 31 and the counting rate (Wc) of the digital integrator 37 for SPD2X and SPD1X to maintain constant PLL damping factor. SPD1X, with the smallest value in Ks of $\frac{1}{8}$, has the lowest acquisition speed and the narrowest lock range but the lowest recovered clock jitter.

The adjustment in the scaling factor Ks changes the lock range of the PLL approximated by the following equation in some embodiments:

$$\text{lock range} = \pm 651\text{ppm} * (\tfrac{3}{4}) * (41/44) * K_s$$

where
Ks is the scaling factor of the digital scaler 31;
41/44 is the scaling factor due to the PEP 14;
651 ppm is the max frequency deviation of the FCO 13;
$\tfrac{3}{4}$ is the scaling factor of the proportional path due to the P/I MUX 40.

The holding range due to the combined proportional and integral paths is approximated by the equation in some embodiments:

$$\text{hold range} = \pm \{651\text{ppm}*(\tfrac{3}{4})*(41/44)*K_s + 651\text{ppm}*(\tfrac{1}{4})\}$$

where
$\tfrac{1}{4}$ is the scaling factor of the integral path due to the P/I MUX 40.

When the acquisition control circuit steps through the different speed settings during the acquisition process, the lock range and hold range are altered and their approximate values are listed in Table 4.

TABLE 4

| Speed | Ks | Lock Range in ppm | Hold Range in ppm |
|---|---|---|---|
| SPD8X | 1 | ±455 | ±618 |
| SPD4X | ½ | ±228 | ±391 |
| SPD2X | ¼ | ±114 | ±277 |
| SPD1X | ⅛ | ±57 | ±220 |

Users can select the final state of the speed counter 35 to either SPD2X or SPD1X by setting the logic state of SPD_SEL through LC_BUS 30. SPD1X is selected by default upon power-up. A logic "1" at SPD-SEL selects SPD2X for wider lock range for non FDDI applications.

When the signal level falls below the detection threshold of the optical receiver 10, SD de-asserts. Users can select either the closed loop mode or the open loop mode during SD de-assertion by setting the logic state of SD_OLP through LC_BUS 30. A logic "1" at SD_OLP selects the closed loop mode during SD deassertion; in addition, SPD8X is also selected.

Upon power up, SD-OLP is cleared to select the open loop mode during the SD de-assertion. Under this mode, P_VALID is forced to logic "0" ignoring any information passing to the loop filter. The recovered clock of the PLL (P_CLK) remains at the frequency determined by the last known integrator 37 content.

To facilitate the testing of the loop filter and PLL performance parameters, the filter provides several multi-bit read/write-able ports for the exchange of test data between an external test system and filter blocks. The loop filter 16, for example, includes two 8-bit parallel ports, LC_PORT and FA_PORT. Users can configure the loop filter 16 and extract data for analyzing the loop's characteristics through these two ports.

The LC_PORT is an 8-bit write register, accessible through the LC_BUS 30, and is used for setting two of the loop filter's parameters as well as configuring the loop filter into one of eight loop configurations for diagnosis purposes. Table 5 shows representative bit definitions.

TABLE 5

| Bit | Name | Function |
|---|---|---|
| 7 | | Un-used |
| 6 | SD_OLP | A logic "0" (defaulted state upon power-up) selects open loop mode when SD is low. A logic "1" selects closed loop mode when SD is low. |
| 5 | TST_MDE2 | These 3 bits are used for |
| 4 | TST_MDE1 | selecting one of the 8 loop |
| 3 | TST_MDE0 | configurations. |
| 2 | ITG_CLR | When ITG_CLR is set to "1", CLR_ITG centers the integrator's contents. |
| 1 | SPD_SEL | A logic "0" (defaulted state upon power-up) selects the final speed of SPD1X after acquisition. A logic "1" selects the final speed of SPD2X. |
| 0 | | Un-used. |

The FA_PORT includes an 8-bit read register and an 8-bit write register. This port is accessible through a bus $FA_{13}$ BUS 41, and allows the user to access the upper 8 bits of the 9-bit counter of the digital integrator 37. Frequency information can be obtained by reading the FA_PORT for evaluating the loop characteristics. Writing to the FA_PORT allows for an easy means for setting the free-running frequency of the loop for testing purposes. The FA_PORT provides a maximum frequency coverage (FCO 13 output frequency deviation due to the integral path) of ±163 ppm (±651×¼) over 256 steps. The frequency resolution provided by the 8-bit FA_PORT is given by: 2×163/(256 steps)=1.3 ppm per binary step.

EXAMPLE

Figure 9B:
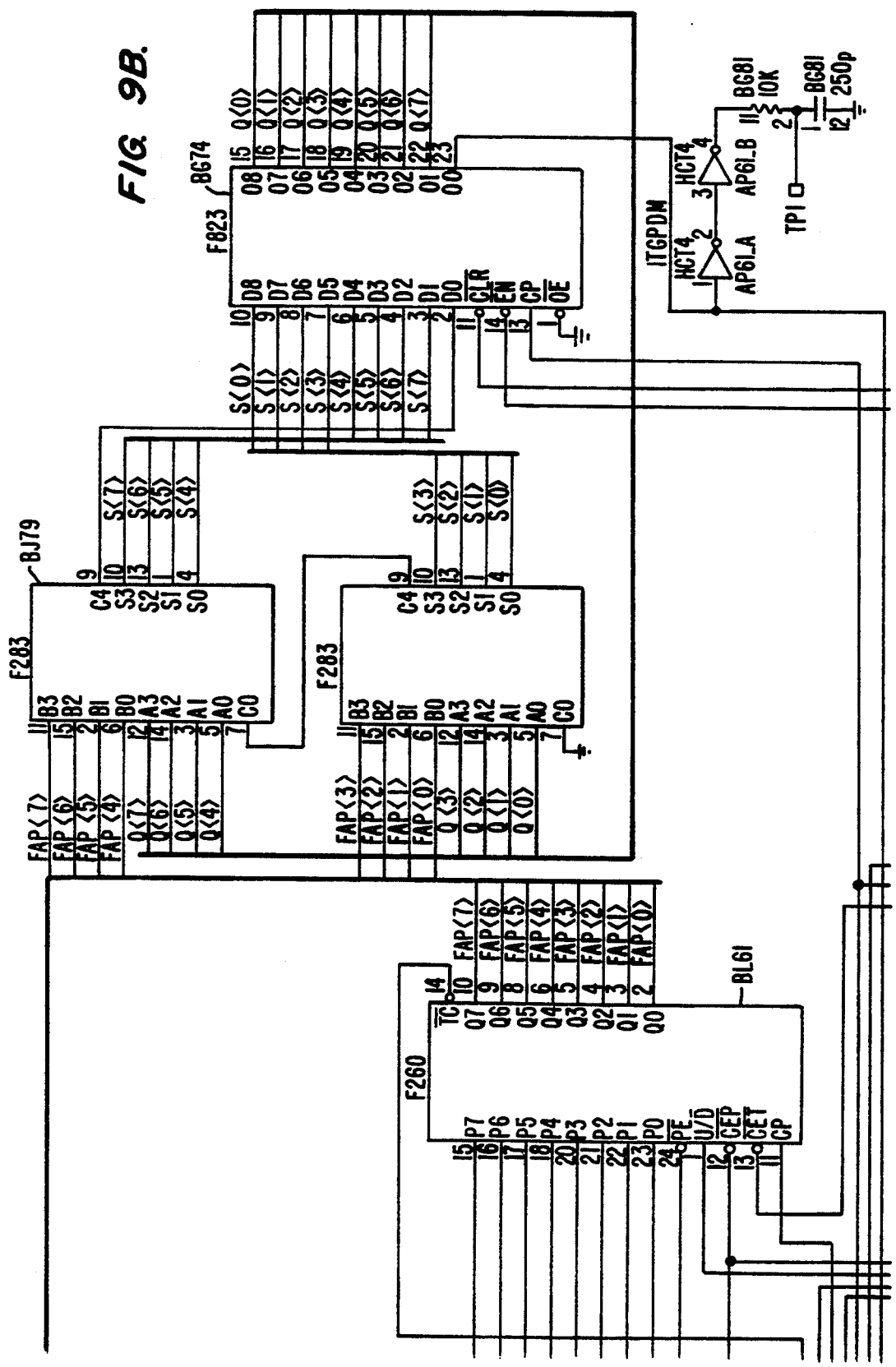
FIG. 9 is a schematic diagram of an example of a breadboard implementation of the digital loop filter.
Figure 9C:
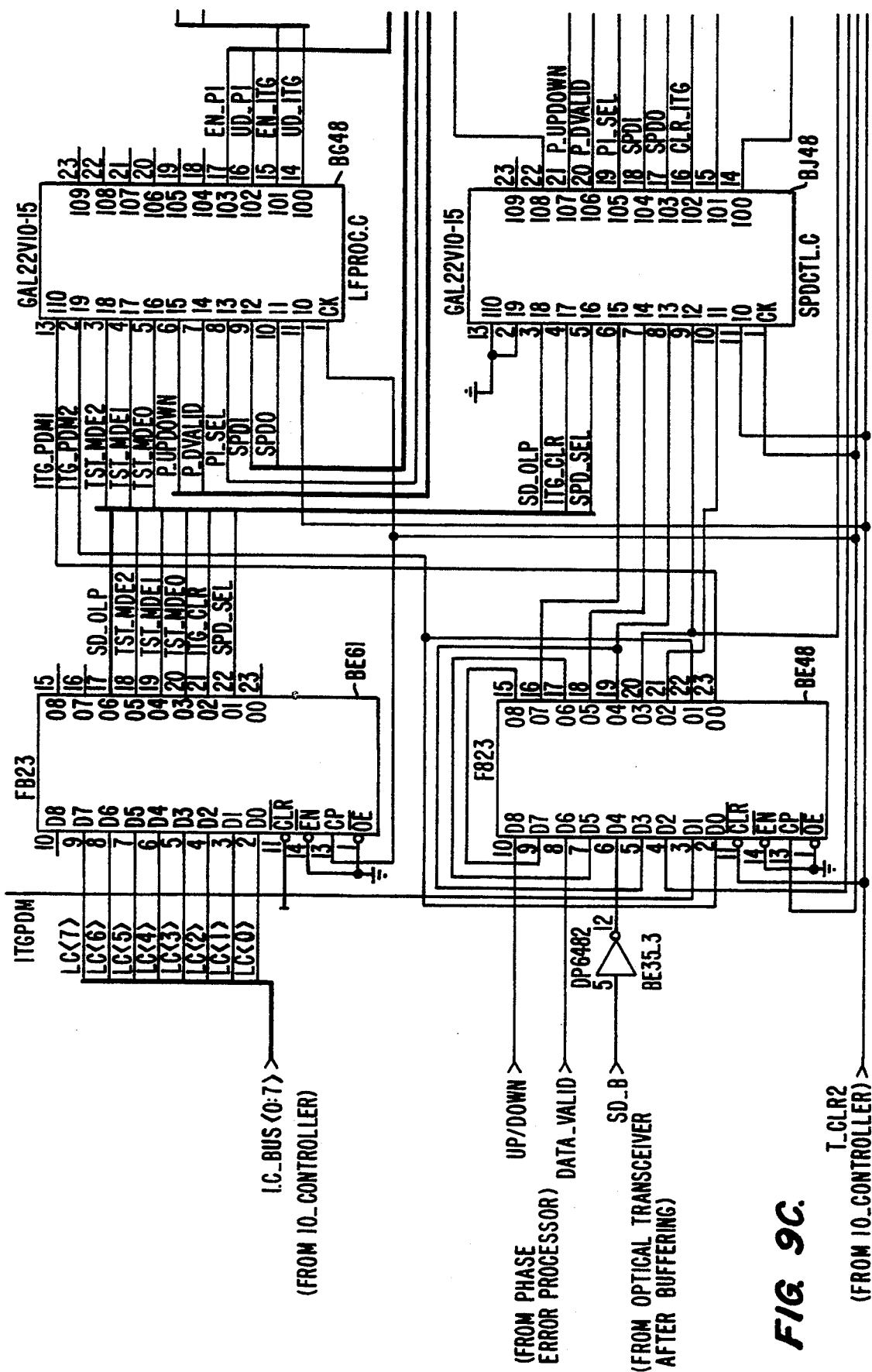
Figure 9D:
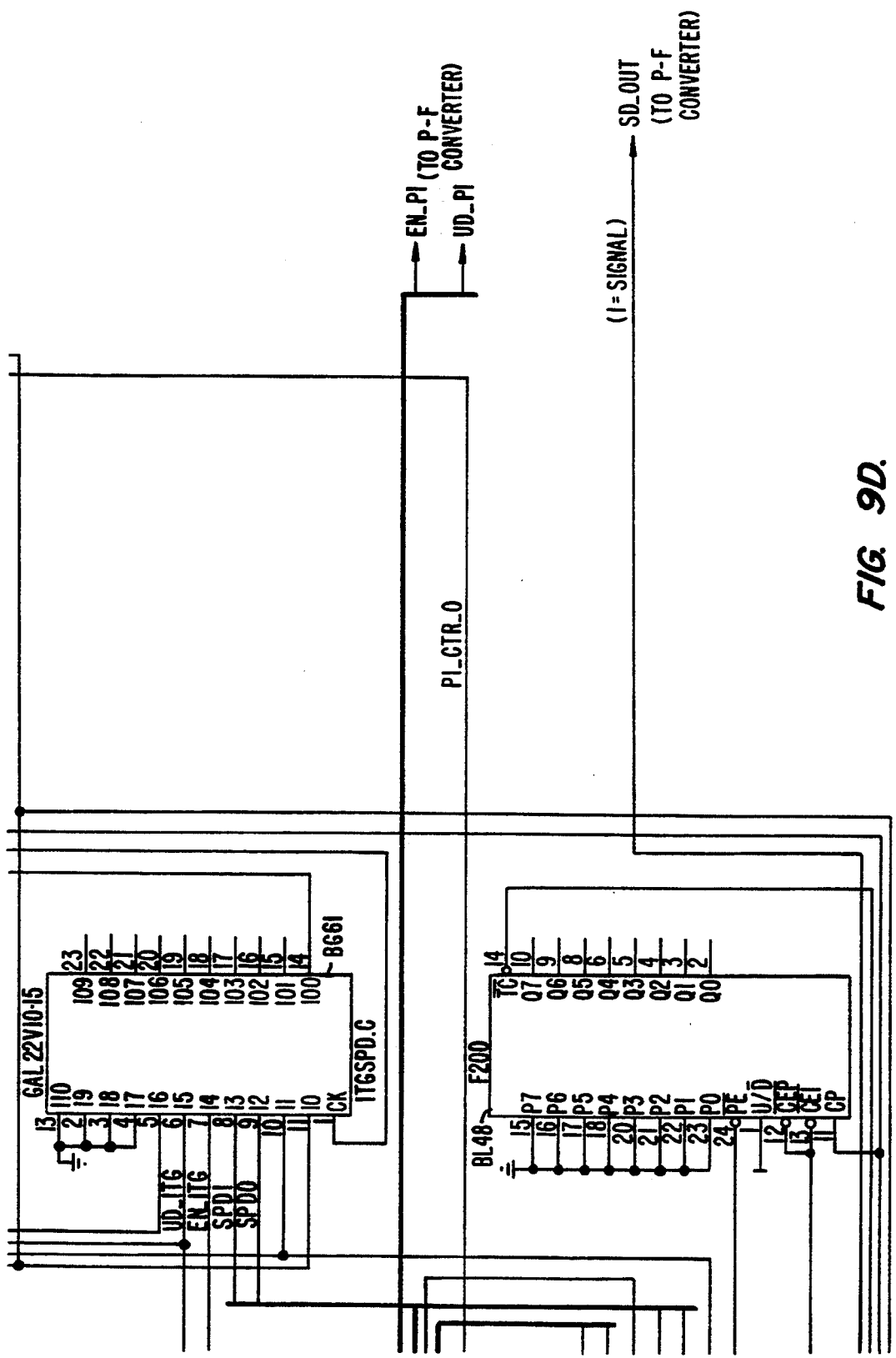

FIG. 9 shows one example of an implementation of the digital loop filter of the present invention. This breadboard implementation of the loop filter was used together with other PLL circuit blocks (described above) to form a 125 MHz PLL for FDDI applications.

The state machines for the loop filter and acquisition speed control were implemented using four programmable logic device (PLD) chips (part no. GAL22V10).

Referring to FIG. 9, the first PLD marked as BG48 implements the functions of the digital scaler 31, the time-multiplexing of the outputs from the scaler 31 and the integrator 37, as well as configuring the loop filter. The second PLD marked as BJ48 implements the functions of the acquisition speed control circuit as well as sets up the proportional and integral time-slots. The third PLD marked as BG61 implements the 1-bit LSB counter of the integrator 37 and adjusts the counting rate of the integrator 37 in response to SPD0 and SPD1. An 8-bit binary counter (part no. 74F269, marked BL48) is used to control the duration of the four states (SPD8X, SPD4X, SPD2X, and SPD1X). The fourth PLD marked as BN61 limits the maximum and minimum countings of the integrator 37, centers the integrator 37 by loading hexadecimal 80 to the upper 8 bits of the integrator 37, and loads an 8-bit word onto the integrator 37 from an 8-bit INT_IO_BUS. The source files for the first PLD through the fourth are listed in Appendices 1 through 4, respectively.

The INT_IO_BUS<0:7> is used for accessing the FA_PORT and is connected to the fourth PLD BN61.

Through this BN61 PLD, users can write into the upper 8 bits of the integrator 37 which was implemented by an 8-bit up/down counter (part no. 74F269, marked BL61). The INT_IO_BUS is also connected to a tri-state buffer (part no. 74F823, marked BN48) which provides the necessary buffering for reading the integrator 37 contents. Three control signals (OE_FAP, FRZ_DTA, LD_FAP) from the I/O controller control I/O access to the FAP port.

The loop filter was implemented with synchronous circuits clocked by C16B, C16C, and C16D, all at 15.625 MHz. Three separate clock lines were used to distribute the loading on the clock line. The two filter inputs UP/DOWN and DATA_VALID as well as the SD_B input are latched into a 9-bit register (part no. 74F823, marked BE48) using C16B to synchronize these signals with the filter clock.

The pulse density modulator 38 was implemented using two 4-bit binary adders (part no. 74F283, marked BJ79 and BJ70) and 9-bit flip-flops (part no. 74F823, marked BG74). The LC_BUS<0:7> is used for setting the loop configuration (see Table 5) by writing into a 9-bit pipeline register (part no. 74F823, marked BE61). The T_CLR2 control signal, also from the I/O controller, is used to perform power-up reset to the loop filter as discussed above. The SD_B signal from the optical receiver 10 is re-clocked by C16B and generates an SD_OUT signal that is required by the phase to frequency converter 18. All TTL parts were powered from Vcc=+5 v to GND=0 v.

Appendix 1, (c) Copyright 1990, National Semiconductor Corporation, is a representative software listing for the programmable logic device GAL22V10 at location BG48. Appendix 2, (c) Copyright 1990, National Semiconductor Corporation, is a representative software listing for the programmable logic device GAL22V10 at location BJ48. Appendix 3, (c) Copyright 1990, National Semiconductor Corporation, is a representative software listing for the programmable logic device GAL22V10 at location BG61. Appendix 4, (c) Copyright 1990, National Semiconductor Corporation, is a representative software listing for the programmable logic device GAL22V10 at location BN61. The attached appendices provide details for programming of the programmable logic devices shown in FIG. 9.

In conclusion, the present invention offers a digital serial programmable loop filter for high frequency control systems with minimized silicon area and improved performance over process variations. While the above is a complete description of the preferred embodiment of the present invention, it is possible to use various alternatives, modifications and equivalents. For example, the speed counter 35 or other portions of the system can have more or fewer bits for a greater number of speed settings providing for finer programmability, and the like. Therefore, the scope of the invention should be determined not with reference to the above description but should, instead, be determined with reference to the appended claims, along with their full scope of equivalents.

What is claimed is:

1. A digital serial programmable loop filter for high frequency control systems comprising:
    an input terminal adapted to receive a serial digital input signal carrying loop error information;
    a serial digital signal processor coupled to said input terminal for filtering said input signal by processing pulse densities of said input signal;
    an output terminal coupled to said processor for carrying a serial output signal representing the filtered value of said serial input signal; and
    means coupled to said serial digital signal processor for controlling from an outside control source at least one processing parameter of said filter.

2. A digital serial programmable loop filter for high frequency control systems comprising:
    an input terminal adapted to receive a serial digital input signal carrying loop error information;
    a serial digital signal processor coupled to said input terminal for filtering said input signal by processing pulse densities of said input signal;
    an output terminal coupled to said processor for carrying a serial output signal representing the filtered value of said serial input signal; and
    means coupled to said serial digital signal processor for adjusting a configuration of said filter to at least an open loop and closed loop configuration.

3. A digital serial loop filter for high frequency control systems comprising:
    an input terminal adapted to receive a serial digital input signal carrying loop error information;
    a serial digital signal processor coupled to said input terminal for filtering said input signal by processing pulse densities of said input signal;
    an output terminal coupled to said processor for carrying a serial output signal representing the filtered value of said serial input signal; and
    parallel ports coupled to said serial digital signal processor for interfacing with a microprocessor, said microprocessor programmed to configure said loop.

4. A digital serial loop filter as recited in claim 3 wherein said microprocessor is further programmed to access internal contents of said loop filter.

5. A digital serial loop filter as recited in claim 3 wherein said serial digital signal processor comprises a proportional path and an integral path, said integral path comprising:
    a digital integrator;
    a pulse density modulator coupled to said digital integrator.

6. A digital serial loop filter as recited in claim 5 further comprising a smoothing filter connected to an output of said pulse density modulator.

7. A digital serial loop filter as recited in claim 3 wherein said loop filter is clocked at a rate of about 15 MHz or greater.

8. A digital serial loop filter as recited in claim 3 further comprising a second input terminal adapted to receive a data valid signal, said data valid signal indicative of valid data being input to said loop filter.

9. A digital serial loop filter as recited in claim 3 wherein said serial digital signal processor comprises a proportional path.

10. A digital serial loop filter as recited in claim 3 wherein said serial digital signal processor comprises an integral path.

11. A digital serial loop filter as recited in claim 3 wherein said serial digital signal processor comprises a proportional path and an integral path.

12. A digital serial loop filter for high frequency control systems comprising:

an input terminal adapted to receive a serial digital input signal carrying loop error information;

a serial digital signal processor, having a proportional path and an integral path, coupled to said input terminal for filtering said input signal by processing pulse densities of said input signal; and an output terminal coupled to said processor for carrying a serial output signal representing the filtered value of said serial input signal, wherein said proportional path is placed in front of said integral path whereby a damping factor of said loop is proportional to about a ratio of a transfer function of said proportional path to a transfer function of said integral path, and where n said serial digital signal processor adjusts scaling factors of said proportional path and said integral path substantially linearly.

13. A digital serial loop filter for high frequency control systems comprising:

an input terminal adapted to receive a serial digital input signal carrying loop error information;

a serial digital signal processor coupled to said input terminal for filtering said input signal by processing pulse densities of said input signal, said processor comprising:
(i) a proportional path;
(ii) an integral path; and
(iii) a time slot sequencer coupled to said proportional and integral paths to time multiplex at least two proportional and two integral serial signals onto two outputs; and an output terminal coupled to said processor for carrying a serial output signal representing the filtered value of said serial input signal.

14. A digital serial loop filter as recited in claim 13 wherein said time slot sequencer generates a control signal with a duty cycle, said duty cycle introducing scaling factors of said proportional path and said integral path.

15. A high frequency Phase-Locked Loop (PLL) comprising:

a receiver circuit with an input and an output, for receipt of a high frequency digital input signal;

a phase detector having a first input for receipt of said input signal via said receiver circuit output, and a second input for receipt of a loop clock signal, said phase detector determining a phase error value between said input signal and said loop clock signal and transmitting said phase error value on a first and a second output terminal;

a phase error processor having two outputs and two inputs for receiving said phase error value from said phase detector outputs, and transforming said phase error value into two serial signals ready for digital filtering;

a digital serial loop filter with programmable loop variables having two inputs to receive said phase error processor outputs and two outputs, for filtering said serial signals by processing a pulse densities of said serial signals and an acquisition time controller to automatically adjust acquisition speed of the PLL;

a phase to frequency converter having two inputs for receiving said digital serial loop filter outputs, said phase to frequency converter generating a frequency based signal from said filter output signals at an output;

an oscillator circuit for generating a local reference clock signal;

a frequency controlled oscillator for receiving said phase to frequency converter output and said local clock signal and generating said loop clock signal; and an input/output controller facilitating an interface between a microprocessor and said digital loop filter, said phase to frequency converter, and said acquisition speed controller via a multi-bit bidirectional bus.

16. A high frequency PLL as in claim 15 wherein said digital serial loop filter comprises:

means for serial processing of pulse densities of an input signal coupled to said two inputs and having a proportional path and an integral path;

means coupled to said processing means for time-multiplexing said proportional and said integral signal paths;

means coupled to said proportional and integral paths for programming loop variables by controlling a step size of said proportional and said integral paths, and for controlling a speed of acquisition time for the loop filter; and means coupled to said processing means and controlled by said microprocessor for configuring the loop in a plurality of different loop configurations including, open loop, closed loop; first order loop, second order loop, and configurations for testing purposes.

17. A digital serial loop filter for high frequency, second order phase-locked loop (PLL) applications comprising:

a proportional path including a digital scaler with two inputs and two outputs, for scaling pulse densities of a serial input signal;

an integral path including a digital integrator having two inputs coupled to said digital scaler outputs, and a plurality of outputs;

a multi-bit pulse density modulator to convert said plurality of digital integrator outputs to a single serial signal;

a smoothing circuit to convert said single serial signal generated by said pulse density modulator into two signals compatible to said scaler outputs;

a multiplexer for time-multiplexing two outputs of the filter between said digital scaler outputs and said smoothing circuit outputs; and a 2-bit counter for generating 4-time-slot sequences to control said multiplexer.

18. A high frequency digital loop filter as in claim 17, further comprising:

an acquisition speed control circuit to speed up an acquisition time of the second order PLL; and a test mode select circuit for configuring the loop in a plurality of different loop configurations including, open loop, closed loop, first order loop, second order loop, and configurations for testing purposes.

* * * * *